(12) United States Patent
Lu

(10) Patent No.: US 8,211,722 B2
(45) Date of Patent: Jul. 3, 2012

(54) FLIP-CHIP GAN LED FABRICATION METHOD

(76) Inventor: Lien-Shine Lu, Taipei (TW)

( * ) Notice: Subject to any disclaimer, the term of this patent is extended or adjusted under 35 U.S.C. 154(b) by 0 days.

(21) Appl. No.: 13/165,238

(22) Filed: Jun. 21, 2011

(65) Prior Publication Data

US 2011/0294242 A1    Dec. 1, 2011

Related U.S. Application Data

(63) Continuation-in-part of application No. 12/505,991, filed on Jul. 20, 2009, now abandoned.

(51) Int. Cl.
*H01L 33/10*      (2010.01)

(52) U.S. Cl. ............... 438/27; 438/26; 438/29; 438/33; 438/42; 438/43; 257/E33.025

(58) Field of Classification Search ............ 438/26, 438/27, 29, 33, 42, 43
See application file for complete search history.

(56) References Cited

U.S. PATENT DOCUMENTS

| | | | |
|---|---|---|---|
| 7,285,801 B2 | 10/2007 | Eliashevich et al. | |
| 2005/0087884 A1* | 4/2005 | Stokes et al. | 257/778 |
| 2008/0121906 A1 | 5/2008 | Yakushiji | |
| 2008/0157097 A1 | 7/2008 | Kuo et al. | |
| 2008/0211416 A1* | 9/2008 | Negley et al. | 315/193 |
| 2008/0237620 A1 | 10/2008 | Shiue et al. | |
| 2008/0261378 A1* | 10/2008 | Yao et al. | 438/458 |
| 2009/0261361 A1* | 10/2009 | Shen et al. | 257/94 |
| 2010/0012968 A1 | 1/2010 | Yahata et al. | |
| 2010/0120234 A1* | 5/2010 | Yao et al. | 438/478 |
| 2010/0213494 A1* | 8/2010 | Lee | 257/98 |

* cited by examiner

*Primary Examiner* — Alexander Ghyka
(74) *Attorney, Agent, or Firm* — Muncy, Geissler, Olds & Lowe, PLLC

(57) ABSTRACT

A flip-chip LED fabrication method includes the steps of (a) providing a GaN epitaxial wafer, (b) forming a first groove in the GaN epitaxial layer, (c) forming a second groove in the GaN epitaxial layer to expose a part of the N-type GaN ohmic contact layer of the GaN epitaxial layer, (d) forming a translucent conducting layer on the epitaxial layer, (e) forming a P-type electrode pad and an N-type electrode pad on the translucent conducting layer, (f) forming a first isolation protection layer on the P-type electrode pad, the N-type electrode pad, the first groove and the second groove, (g) forming a metallic reflection layer on the first isolation protection layer, (h) forming a second isolation protection layer on the first isolation protection layer and the metallic reflection layer, (i) forming a third groove to expose one lateral side of the N-type electrode pad, (j) separating the processed GaN epitaxial wafer into individual GaN LED chips, and (k) bonding at least one individual GaN LED chip thus obtained to a thermal substrate with a conducting material.

14 Claims, 16 Drawing Sheets

FLIP-CHIP GAN LED FABRICATION METHOD

This application is a Continuation-In-Part of application Ser. No. 12/505,991, filed on Jul. 20, 2009, now pending. The patent application identified above is incorporated here by reference in its entirety to provide continuity of disclosure.

BACKGROUND OF THE INVENTION

1. Field of the Invention

The present invention relates to LED fabrication technology and more particularly, to a flip-chip GaN-based LED fabrication method, which enables a high reliable GaN LED chip to be bonded to a thermal substrate having a large heat dissipation area with a conducting adhesive, facilitating heat dissipation, enhancing the luminous efficiency of the GaN LED chip and prolonging its lifespan.

2. Description of the Related Art

Many different types of light emitting apparatus are commercially available. Following the trend of the next generation for green energy, LED (light emitting diode), more particularly, white LED has been intensively used in street lamps, tunnel lamps, hand lamps, sign boards, home lightings and backlight modules for LCD panel for the advantages of power-saving, small size, high stability and high reliability characteristics.

Commercial white light emitting devices commonly use blue GaN-based LED chips to match with yellow, green or red phosphor. However, a sapphire substrate has the drawback of poor heat transfer characteristic. Temperature will affect he reliability and lifespan of sapphire substrate-based LED chips. According to the luminous efficiency of regular LED devices, about 50%~60% of the power will be turned into heat. Further, according to conventional LED module fabrication methods, phosphor is mixed with epoxy resin or silicon adhesive subject to a predetermined ration and then the mixture thus prepared is coated on LED chips. During operation of a conventional LED device, waste heat will be accumulated in the inside of the LED device, lowering the luminous efficiency and shortening the lifespan. An overheat may result in device burnout. Therefore, the factor of heat dissipation efficiency has been greatly emphasized. If waste heat cannot be quickly dissipated during operation of a LED package product, the life cycle and reliability of the product will be badly affected. To facilitate quick dissipation of waste heat, heat pipe, heat-transfer block, heat sink and/or radiation fin may be used with a LED module. However, the use of these attached devices relatively increases the product size, reducing the advantages of small size and light weight of LED products.

FIG. 12 illustrate a GaN LED chip according to the prior art, which comprises a support frame A8, a sapphire substrate A1 supported on the support frame A8 and fixedly bonded thereto with an adhesive, an N-type GaN ohmic contact layer A2 formed on the sapphire substrate A1, a light-emitting layer A3 formed on the N-type GaN ohmic contact layer A2, a P-type GaN ohmic contact layer A4 formed on the light-emitting layer A3, a translucent conducting layer A5 formed on the P-type GaN ohmic contact layer A4 for distributing electric current and enhancing luminous efficiency, a P-type electrode pad A6 and an N-type electrode pad A7 respectively formed on the translucent conducting layer AS and the N-type GaN ohmic contact layer A2, and gold or aluminum wires A9 electrically connecting the P-type electrode pad A6 and an N-type electrode pad A7 to external contacts A10. According to this design, a part of the light emitted by the light-emitting layer A3 goes through the P-type electrode pad A6 outside the translucent conducting layer A5 to the phosphor in the packaged shell. Because the P-type electrode pad A6 blocks a part of the light emitted by the light-emitting layer A3, the luminous efficiency of the LED package is lowered.

To eliminate the aforesaid electrode pad light-blocking problem, U.S. Pat. No. 5,557,115 discloses an improved LED design, entitled "Light emitting semiconductor device with sub-mount", as shown in FIG. 13, which employs flip chip technology to increase the effective light-emitting area. According to this design, the light emitting semiconductor device comprises a sapphire substrate B1, a buffer layer B2 and an N-type GaN ohmic contact layer B3 formed in proper order on the sapphire substrate B1, a light-emitting layer B4 and a P-type GaN ohmic contact layer B5 formed in proper order on the center area of the N-type GaN ohmic contact layer B3, a P-type electrode pad B6 connecting the P-type GaN ohmic contact layer B5 to an external heat-transfer substrate, N-type electrodes B7 disposed at two opposite lateral sides relative to the light-emitting layer B4, and an N-type electrode pad B8 connecting one N-type electrode B7 to the external heat-transfer substrate. Thus, the light-emitting surface B11 is fully opened for emitting light efficiently. However, the use of the metallic P-type electrode pad B6 and N-type electrode pad B8 to reflect light tends to cause an increase of the forward voltage, lowering the luminous efficiency.

FIG. 14 illustrates still another prior art LED design disclosed in U.S. Pat. No. 6,514,782, entitled "Method of making an III-nitride light-emitting device with increased light generating capability". According to this design, LED dies (chips) C1 are electrically connected to solder contacts C11; C21 of a circuit board C2 by means of heat-transfer blocks C3, such as gold balls or gold-tin solder bumps. This method has the drawback of high manufacturing cost. As the electrode pads in the flip-chip LED device are electrically connected to the circuit board and capable of reflecting the light emitted by the light-emitting layer toward the sapphire substrate, the metallic property of the electrode pads tends to cause an increase in the forward voltage, thereby lowering the luminous efficiency. This prior art design discloses the formation of a metallic reflection layer on the circuit board, however, the far distance between the metallic reflection layer and the light-emitting layer causes an attenuation of the emitted light.

FIG. 15 illustrates still another prior art LED design disclosed in U.S. Pat. No. 6,514,782, which comprises a sapphire substrate D1, an N-type GaN ohmic contact layer D2, a light-emitting layer D3, a P-type GaN ohmic contact layer D4, a translucent conducting layer D5 and conducting metallic reflection layer D6. Further, the N-type GaN ohmic contact layer D2 and the translucent conducting layer D5 are respectively and electrically connected to the conducting metallic reflection layer D6 and a circuit board D8 by electrodes D7. Further, in order to prevent conduction between the electrodes D7 and the conducting metallic reflection layer D6 and to protect the conducting metallic reflection layer D6 against current leakage, a polyimide insulation layer D9 is filled in the gaps. However, it is difficult to form the polyimide insulation layer D9 without affecting the relative surface elevation between the electrodes D7 and the conducting metallic reflection layer D6. A significant elevational difference between the electrodes D7 and the conducting metallic reflection layer D6 will lead to a connection error between the LED and the circuit board, lowering the yield rate.

FIG. 16 illustrates a flip-chip GaN-based LED design according to Taiwan Patent M350824. According to this design, an etching technique is employed to divide an epitaxial layer into a first epitaxial layer portion E1 and a second epitaxial layer portion E2 so that the P-type electrode pad E3 and the N-type electrode pad E4 can be approximately maintained at the same elevation. However, in order to reduce the contact impedance between the N-type electrode pad E4 and the second epitaxial layer portion E2, the N-type electrode pad E4 must be extended to form an ohmic contact with an N-type GaN ohmic contact layer E21. This designs enables the he P-type electrode pad E3 and the N-type electrode pad E4 to be approximately maintained at the same elevation, facilitating circuit board connection. However, the metallic reflection layer E5 round the conducting layer E6 tends to increase the forward voltage. Further, this design does not teach any measure to protect the surface of the edge of the grooves in the LED chip.

Further, the aforesaid prior art designs cannot eliminate accumulation of waste heat to lower the luminous efficiency due to high consumption of power. The use of polyimide insulation layer to minimize power consumption relatively lowers heat dissipation performance. Further, if the P-type electrode pad and the N-type electrode pad are not maintained at the same elevation, circuit board connection may fail, lowering the yield rate.

Therefore, it is desirable to provide a flip-chip LED, which eliminates the drawbacks of the aforesaid prior art designs.

SUMMARY OF THE INVENTION

The present invention has been accomplished under the circumstances in view. It is one object of the present invention to provide a flip-chip LED fabrication method, which improves the product quality and the yield rate, facilitates heat dissipation, enhances the luminous efficiency and prolongs the product lifespan.

To achieve these and other objects of the present invention, a flip-chip LED fabrication method includes the steps of: (a) providing a GaN (Gallium Nitride) epitaxial wafer comprising a substrate and a GaN epitaxial layer arranged on the substrate, the GaN epitaxial layer comprising a N-type GaN ohmic contact layer, a light-emitting layer and a P-type semiconductor layer; (b) forming a first groove in the GaN epitaxial layer at a predetermined location by etching to expose a part of the substrate of the GaN epitaxial wafer; (c) forming a second groove in the GaN epitaxial layer at a predetermined location adjacent to the first groove by etching to expose a part of the N-type GaN ohmic contact layer of the GaN epitaxial layer and to divide the GaN epitaxial layer into two epitaxial layer portions; (d) forming a translucent conducting layer on the epitaxial layer portions; (e) forming a P-type electrode pad and an N-type electrode pad on the translucent conducting layer corresponding to the epitaxial layer portions respectively; (f) forming a first isolation protection layer on the P-type electrode pad, the N-type electrode pad, the first groove and the second groove; (g) forming a metallic reflection layer on the first isolation protection layer adjacent to the P-type electrode pad and corresponding to the translucent conducting layer; (h) forming a second isolation protection layer on the first isolation protection layer and the metallic reflection layer; (i) etching the first isolation protection layer and the second isolation protection layer to form a third groove adjacent to the metallic reflection layer and to expose one lateral side of the N-type electrode pad; (j) employ grinding, laser wafer scribing, chipping and die sorting techniques to separate the processed GaN (Gallium Nitride) epitaxial wafer into multiple individual GaN LED chips; and (k) bonding at least one individual GaN LED chip thus obtained to a thermal substrate with a conducting material to electrically connect the P-type electrode pad and N-type electrode pad of each individual GaN LED chip to the positive solder pad and negative solder pad of the thermal substrate by the conducting adhesive and to let the conducting adhesive climb over the N-type electrode pad into the third groove and be accumulated and cured therein.

As the first isolation protection layer and the metallic reflection layer are respectively formed at two opposite sides relative to the isolation protection layer, the translucent conducting layer and the metallic reflection layer are electrically isolated to minimize forward voltage and power consumption during electricity conduction operation of the metallic reflection layer, avoiding interference with the light-emitting efficiency of the GaN LED chip. Further, the metallic reflection layer is directly mounted inside the GaN LED chip for direct reflection, avoiding light loss.

Further, subject to the formation of the first groove and the second groove in the GaN epitaxial layer by etching to expose a part of the N-type GaN ohmic contact layer of the GaN epitaxial layer and to divide the GaN epitaxial layer into two epitaxial layer portions, the posteriorly formed P-type electrode pad and N-type electrode pad have the same elevation, stabilizing electric connection between the GaN LED chip and the thermal substrate and improving LED module yield rate.

Further, the first isolation protection layer and the second isolation protection layer are formed on the two epitaxial layer portions at two opposite sides relative to the second groove, and therefore, the two epitaxial layer portions are well isolated and protected, avoiding a short circuit and enhancing operation reliability.

Further, the third groove is formed in the first isolation protection layer and the second isolation protection layer adjacent to the metallic reflection layer by etching to expose one lateral side of the N-type electrode pad so that the applied conducting material can climb over the N-type electrode pad into the third groove and be accumulated and cured therein, enhancing the binding strength and the strength of solidification and the connection stability between the N-type electrode pad of the GaN LED chip and the negative solder pad of the thermal substrate.

Further, the GaN LED chip is electrically connected with the thermal substrate by means of the large area conducting material, and the insulative adhesive is bonded to the thermal substrate between the positive solder pad and the negative solder pad so that the second isolation protection layer can be fixedly secured to the thermal substrate between the positive solder pad and the negative solder pad by means of the conducting material, saving the manufacturing cost, facilitating heat dissipation, improving the luminous efficiency of the GaN LED chip and its lifespan.

DETAILED DESCRIPTION OF THE PREFERRED EMBODIMENT

Figure 1:
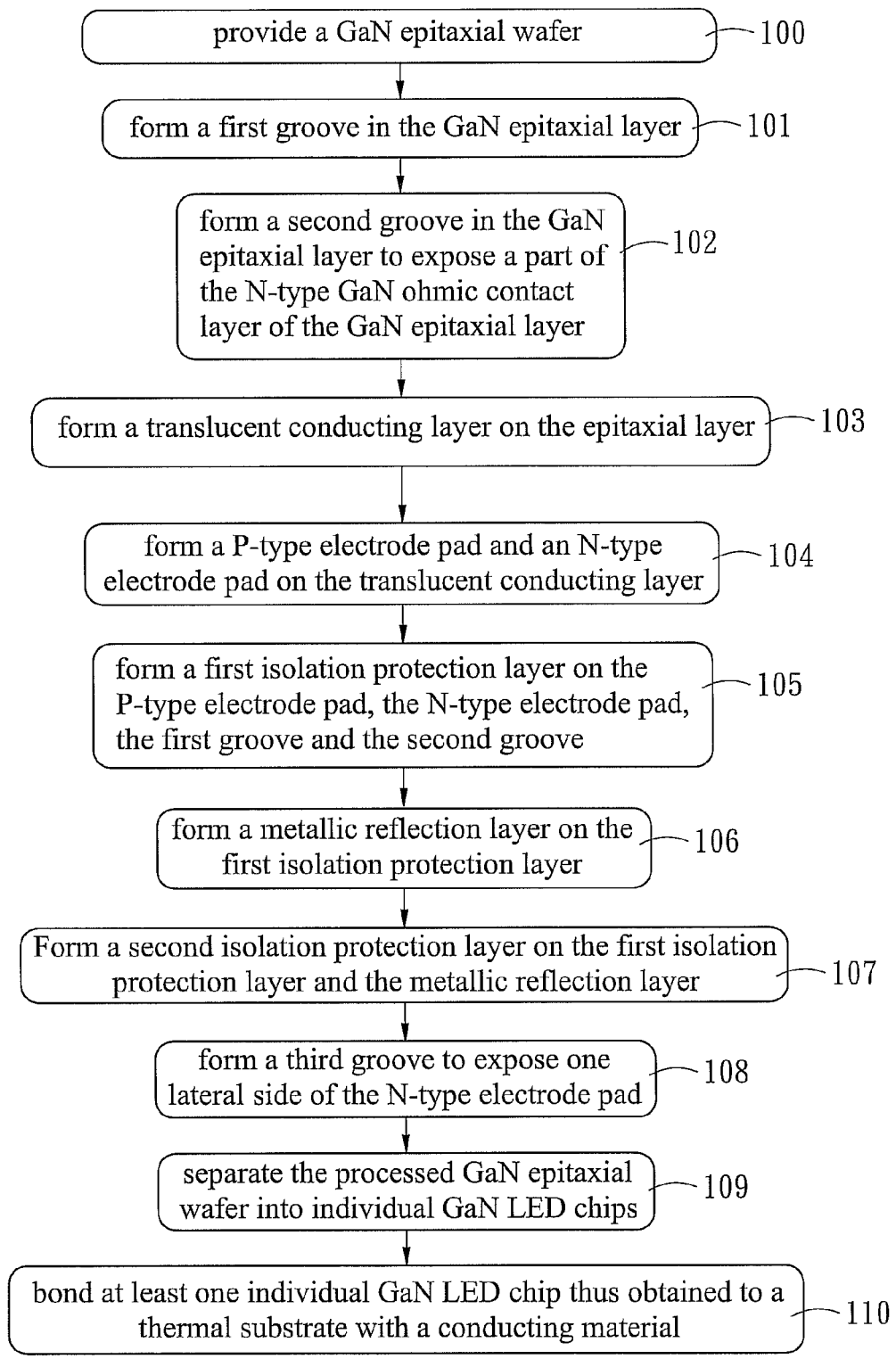
FIG. 1 is a flip-chip LED fabrication flow chart in accordance with the present invention.
Figure 2:
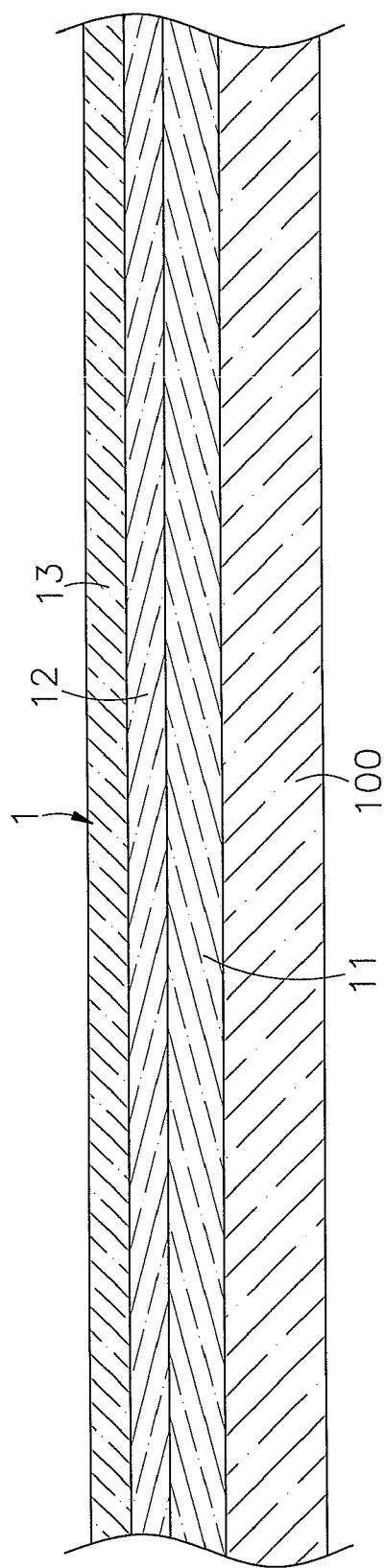
FIG. 2 is a schematic sectional view illustrating the structure of the GaN epitaxial layer of a GaN LED chip prepared in accordance with the present invention.
Figure 3:
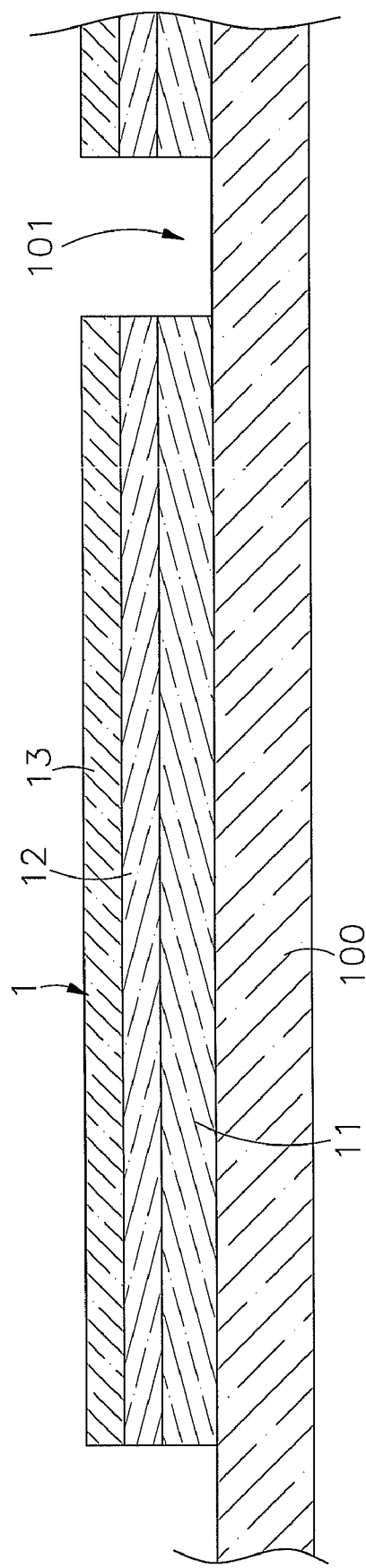
FIG. 3 corresponds to FIG. 2, illustrating a first groove formed in the GaN epitaxial layer.
Figure 4:
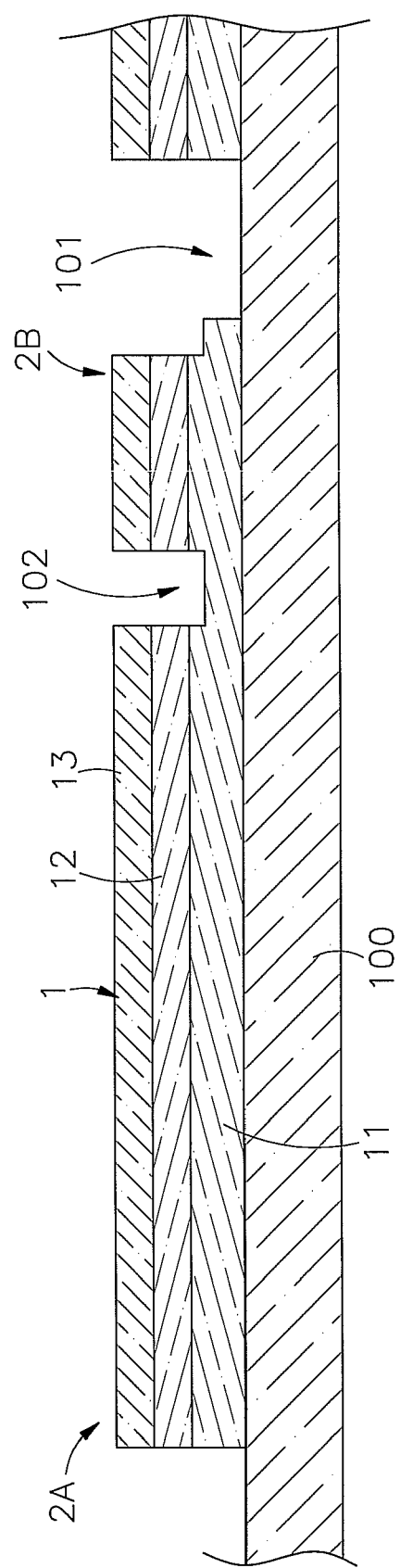
FIG. 4 corresponds to FIG. 3, illustrating a second groove formed in the GaN epitaxial layer.
Figure 5:
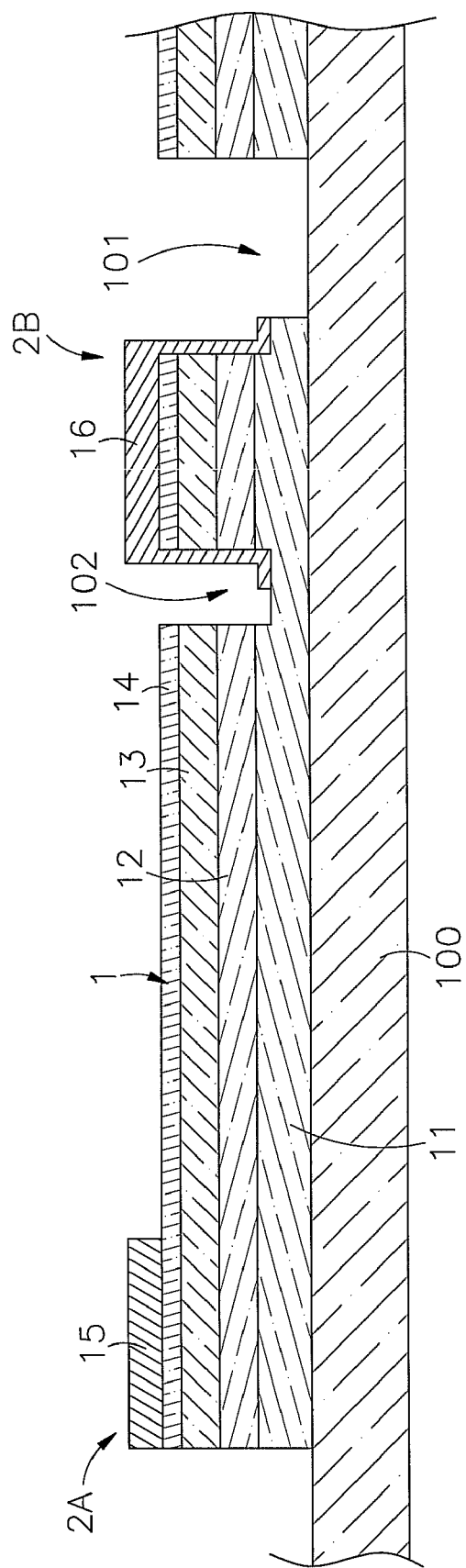
FIG. 5 corresponds to FIG. 4, illustrating a translucent conducting layer formed on the surface of the epitaxial layer portions of the epitaxial layer and a P-type electrode pad and an N-type electrode pad formed on the translucent conducting layer corresponding to the epitaxial layer portions.
Figure 6:
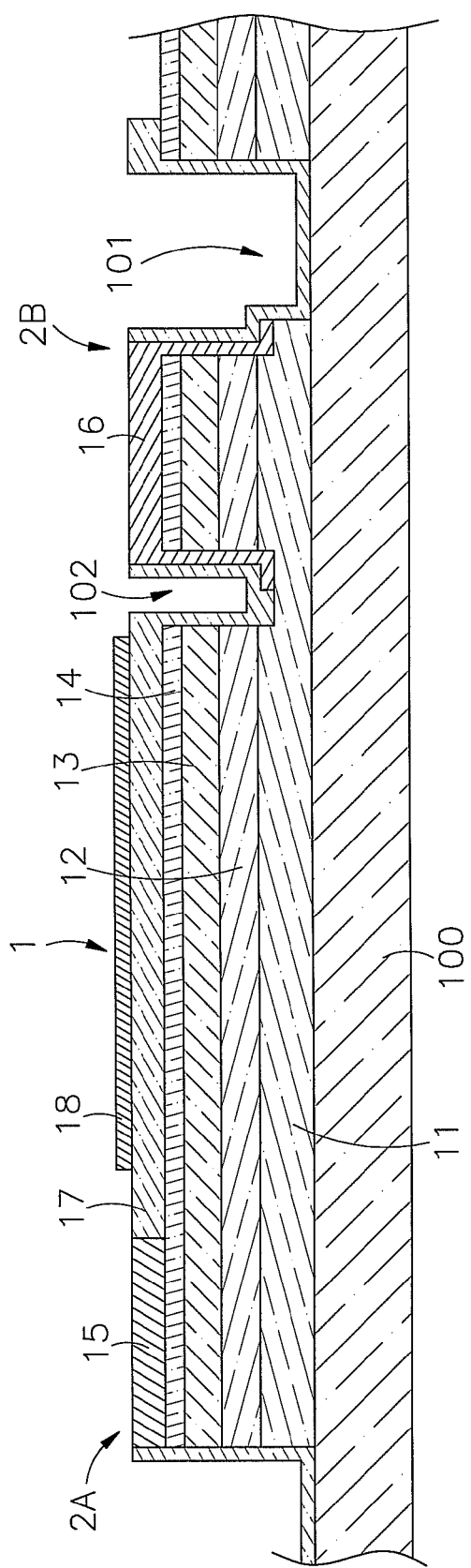
FIG. 6 corresponds to FIG. 5, illustrating a first isolation protection layer formed on the P-type electrode pad, the N-type electrode pad, the first groove and the second groove and a metallic reflection layer formed on the surface of the first isolation protection layer adjacent to the P-type electrode pad and corresponding to the translucent conducting layer.
Figure 7:
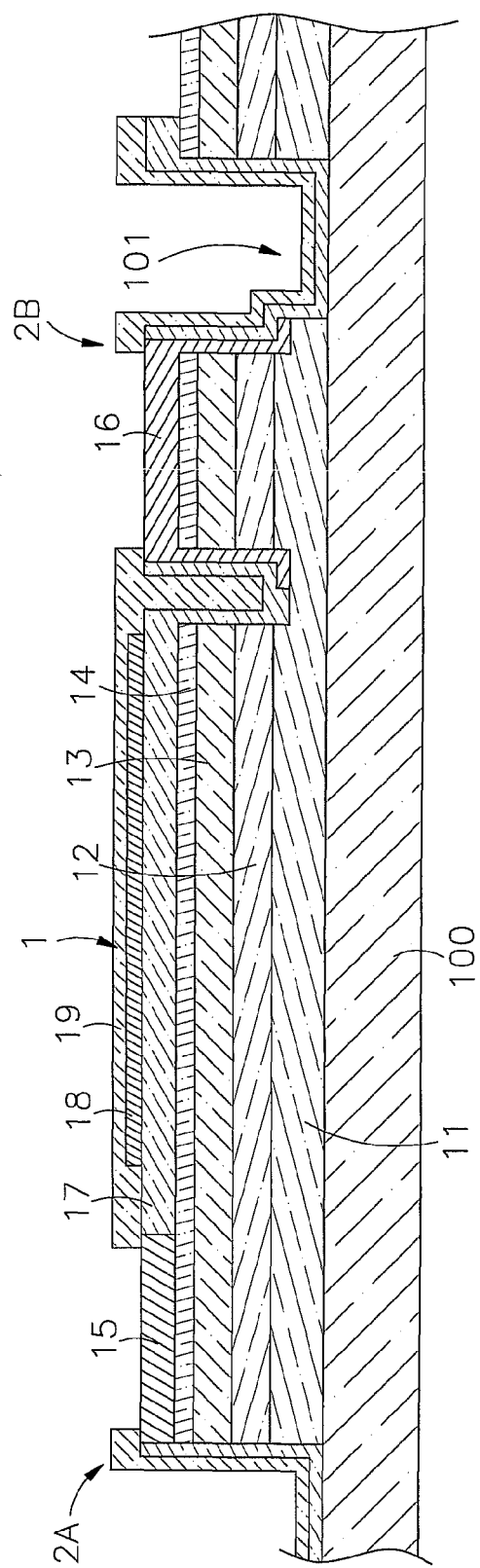
FIG. 7 corresponds to FIG. 6, illustrating a second isolation protection layer on the surface of the first isolation protection layer and the metallic reflection layer.
Figure 8:
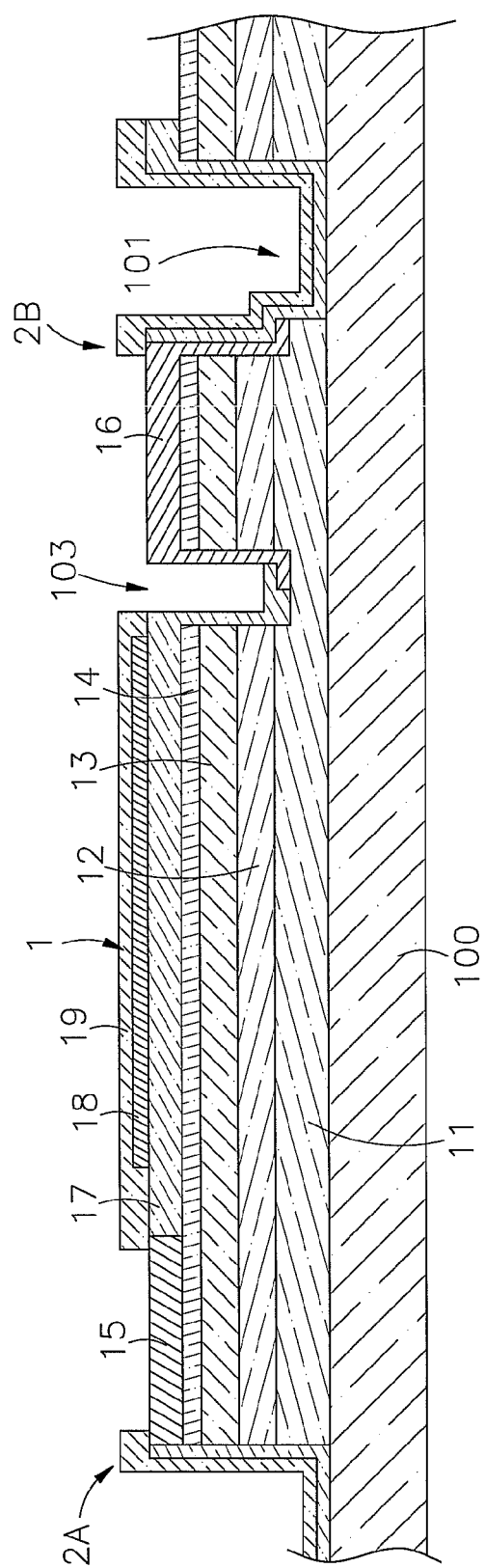
FIG. 8 corresponds to FIG. 7, illustrating a third groove formed in the first isolation protection layer and the second isolation protection layer adjacent to the metallic reflection layer and one lateral side of the N-type electrode pad exposed to the outside.
Figure 9:
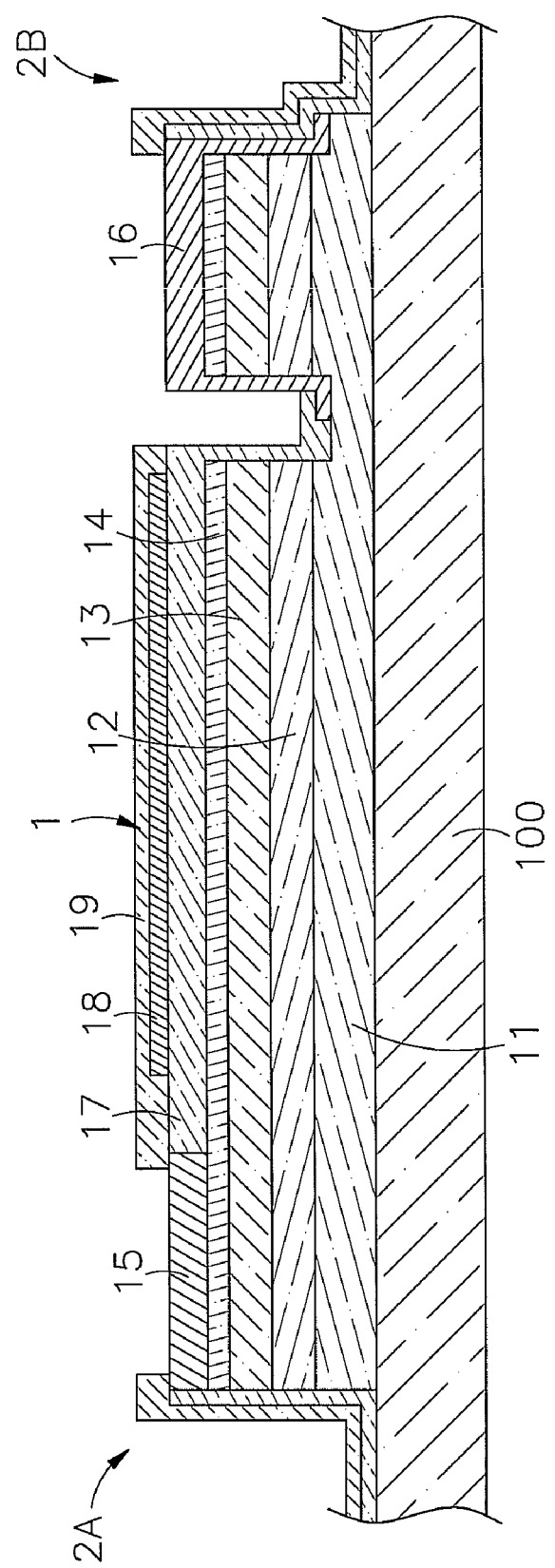
FIG. 9 is a schematic sectional view of an individual GaN LED chip obtained according to the present invention.

Referring to FIGS. 1~4, a flip-chip LED fabrication method in accordance with the present invention includes the steps of:
(100) Provide a GaN (Gallium Nitride) epitaxial wafer consisting of a GaN epitaxial layer 2, which comprises a N-type GaN ohmic contact layer 11, a light-emitting layer 12 and a P-type semiconductor layer 13 and is arranged on a substrate 100 (see FIG. 2).
(101) Form a first groove 101 in the GaN epitaxial layer 2 at a predetermined location by etching to expose a part of the substrate 100 of the GaN epitaxial wafer (see FIG. 3).
(102) Form a second groove 102 in the GaN epitaxial layer 2 at a predetermined location adjacent to the first groove 101 by etching to expose a part of the N-type GaN ohmic contact layer 11 of the GaN epitaxial layer 2 so that the GaN epitaxial layer 2 is divided by the second groove 102 into two epitaxial layer portions 2A; 2B (see FIG. 4).
(103) Form a translucent conducting layer 14 on the surface of the epitaxial layer portions 2A; 2B (see FIG. 5).
(104) Form a P-type electrode pad 15 and an N-type electrode pad 16 on the translucent conducting layer 14 (see FIG. 5) corresponding to the epitaxial layer portions 2A; 2B respectively.
(105) Form a first isolation protection layer 17 on the P-type electrode pad 15, the N-type electrode pad 16, the first groove 101 and the second groove 102 (see FIG. 6).
(106) Form a metallic reflection layer 18 on the surface of the first isolation protection layer 17 adjacent to the P-type electrode pad 15 and corresponding to the translucent conducting layer 14 (see FIG. 6).
(107) Form a second isolation protection layer 19 on the surface of the first isolation protection layer 17 and the metallic reflection layer 18 (see FIG. 7).
(108) Etch the first isolation protection layer 17 and the second isolation protection layer 19 to form a third groove 103 adjacent to the metallic reflection layer 18 and to expose one lateral side of the N-type electrode pad 16 (see FIG. 8).
(109) Employ a series of steps including grinding, laser wafer scribing, chipping and die sorting to obtain individual GaN LED chips 1 (see FIG. 9).
(110) Bond each individual GaN LED chip 1 to a thermal substrate 3 with a conducting adhesive 4 (see FIG. 10).

Referring to FIGS. 2~9, a N-type GaN ohmic contact layer 11, a light-emitting layer 12 and a P-type semiconductor layer 13 are formed on a substrate 100 in proper order, and then a photo mask is designed at a selected location and then exposing and developing techniques are employed to remove the photoresist from the GaN epitaxial layer 2 corresponding a predetermined area for first groove 101. Thereafter, an etching technique (dry etching or wet etching technique) is employed to remove a part of the GaN epitaxial layer 2 from the substrate 100, thereby forming a first groove 101 to expose a part of the substrate 100 of the GaN epitaxial wafer. Thereafter, employ exposing and developing techniques to remove the photoresist from the GaN epitaxial layer 2 corresponding a predetermined area for second groove 102, and then employ an etching technique to remove a part of the GaN epitaxial layer 2 from the substrate 100, thereby forming a second groove 102 to expose a part of the N-type GaN ohmic contact layer 11 of the GaN epitaxial layer 2. The etching depth of the first groove 101 is deeper than that of the second groove 102.

Thereafter, employing a vapor deposition or sputter deposition technique to form a translucent conducting layer 14 on the surface of the P-type semiconductor layer 13, and then employ exposing, developing and lift-off techniques to form a P-type electrode pad 15 and an N-type electrode pad 16 on the translucent conducting layer 14, enabling the N-type electrode pad 16 to extend to the surface of the N-type GaN ohmic contact layer 11. Thereafter, form a first isolation protection layer 17 on the P-type electrode pad 15, the N-type electrode pad 16, the first groove 101 and the second groove 102, enabling the first groove 101 and the second groove 102 to be completely covered by the first isolation protection layer 17. Thereafter, employ exposing developing and etching techniques to expose the surface of the -type electrode pad 15 and the surface of the N-type electrode pad 16, and then employ exposing, developing and lift-off techniques to form a metallic reflection layer 18 on the surface of the first isolation protection layer 17 adjacent to the P-type electrode pad 15 and corresponding to the translucent conducting layer 14, and then form a second isolation protection layer 19 on the surface of the first isolation protection layer 17 and the surface of the metallic reflection layer 18, and then employ exposing, developing and etching techniques to form a third groove 103 adjacent to the metallic reflection layer 18 and to expose one lateral side of the N-type electrode pad 16, and then employ exposing, developing and etching techniques to expose the surface of the P-type electrode pad 15 and the surface of the N-type electrode pad 16. Thereafter, grind the substrate 100 to a thickness below 100 μm, and then employ laser wafer scribing, chipping and die sorting techniques to separate the processed wafer into individual GaN LED chips 1.

Figure 10:
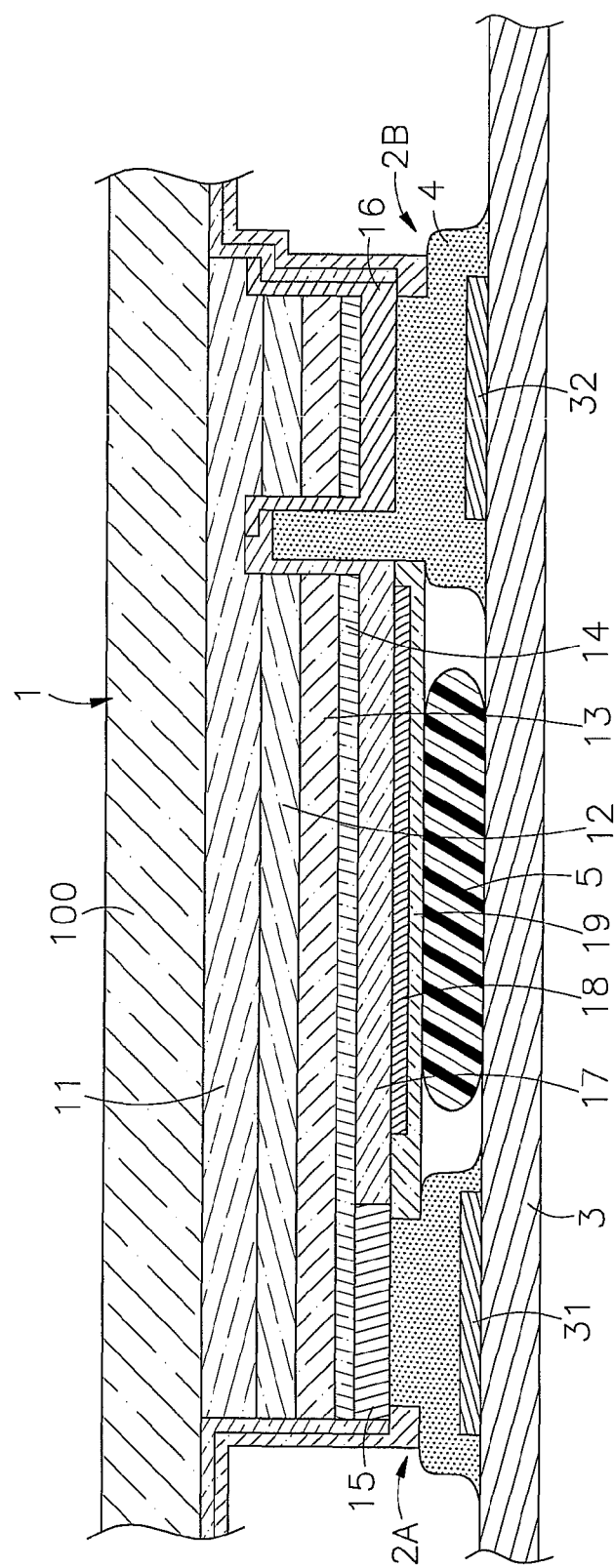
FIG. 10 is a schematic drawing illustrating an individual GaN LED chip bonded to a thermal substrate with a conducting adhesive.

Referring to FIG. 10, an individual GaN LED chip 1 can be electrically connected to a thermal substrate 3 by means of flip-chip packaging. The thermal substrate 3 can be prepared by aluminum, copper, ceramics or any suitable thermally conductive material, carrying a printed circuit having electrically insulated positive solder pad 31 and negative solder pad 32 and a conducting material 4 (silver adhesive, solder balls or solder paste) formed on the positive solder pad 31 and the negative solder pad 32 and/or the thermal substrate 3 between the positive solder pad 31 and the negative solder pad 32. During flip-chip packaging, the P-type electrode pad 15 and N-type electrode pad 16 of the GaN LED chip 1 are respectively electrically connected to the positive solder pad 31 and negative solder pad 32 of the thermal substrate 3 through the conducting material 4, and the second isolation protection layer 19 is bonded to the thermal substrate 3 between the positive solder pad 31 and the negative solder pad 32 with an insulative adhesive 5 that can be UV light curable adhesive, heat curable adhesive or anaerobic adhesive applied by means of spot gluing or dipping techniques. Thus, the conducting material 4 and the thermal substrate 3 provide a large heat dissipation surface area for quick dissipation of waste heat from the GaN LED chip 1, eliminating the drawbacks of limited heat-transfer surface are of the prior art designs that use metal wires or metal bumps for conduction, and simplifying the LED fabrication process and time.

When curing the individual GaN LED chip 1 and the thermal substrate 3, the conducting material 4 can climb over the N-type electrode pad 16 into the third groove 103 and be accumulated and cured therein, avoiding poor wetting or insufficient solder and enhancing the bonding strength. As the third groove 103 is concealed in the individual GaN LED chip 1, electric connection between the N-type electrode pad 16 of the individual GaN LED chip 1 and the negative solder pad 32 of the thermal substrate 3 is enhanced and well protected, avoiding friction or impact damage.

Further, the substrate 100 of the GaN LED chip 1 can be selected from the group of sapphire, silicon carbon (SiC), zinc oxide (ZnO), magnesium oxide (MgO), gallium oxide ($Ga_2O_3$) aluminum gallium nitride (AlGaN), gallium lithium oxide (GaLiO), aluminum lithium oxide (AlLiO) and Spinel. Further, the translucent conducting layer 14 can be selected from the group of indium oxide (In2O3), tin oxide (SnO2), IMO (indium molybdenum oxide), zinc oxide (ZnO), indium zinc oxide (IZO), cellium indium oxide (CeIn2O3), ITO (indium tin oxide), metallic bi-layer of N/Au, metallic bi-layer of Pt/Au and metallic bi-layer of Be/Au. The metallic reflection layer 18 can be selected from the group of silver (Ag), aluminum (Al), rhodium (Rh) and their composite with nickel (Ni), platinum (Pt), beryllium (Be), titanium (Ti) or chrome (Cr).

Further, the first isolation protection layer 17 and the second isolation protection layer 19 can be selected from the group of silicon oxide ($SiO_2$), silicon nitride ($Si_3N_4$), liquid glass, Teflon, polyimide (PI), aluminum oxide ($Al_2O_3$), titanium oxide (TiO), tantalum oxide (Ta2O5), yttrium oxide ($Y_2O_3$) and diamond thin film and their alloys. Further, the P-type electrode pad 15 and the N-type electrode pad 16 can be selected from the group of titanium-gold alloy, titanium-aluminum alloy, chrome-gold alloy and chrome-aluminum alloy.

Figure 11:
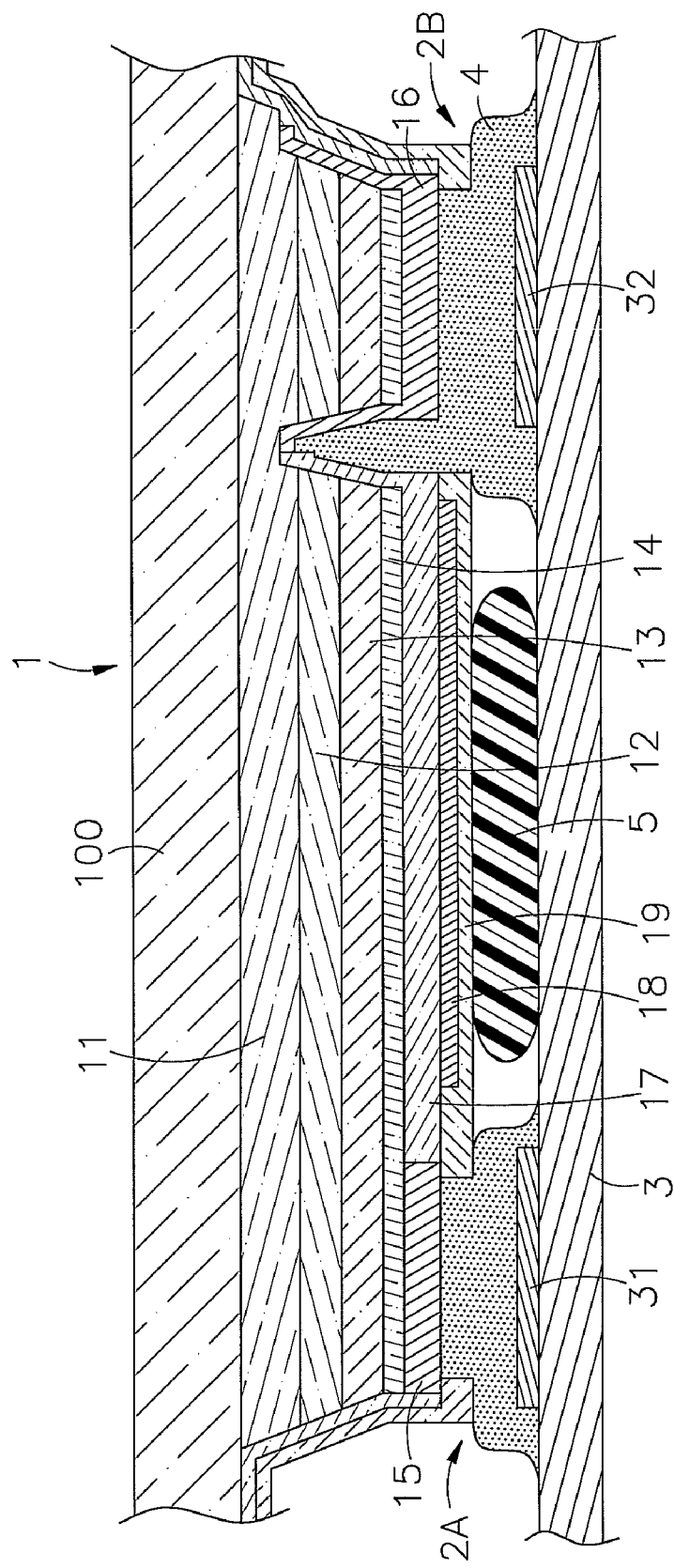
FIG. 11 corresponds to FIG. 10, illustrating the cross section of the first groove, the second groove and the third groove made V-shaped.
Figure 12:
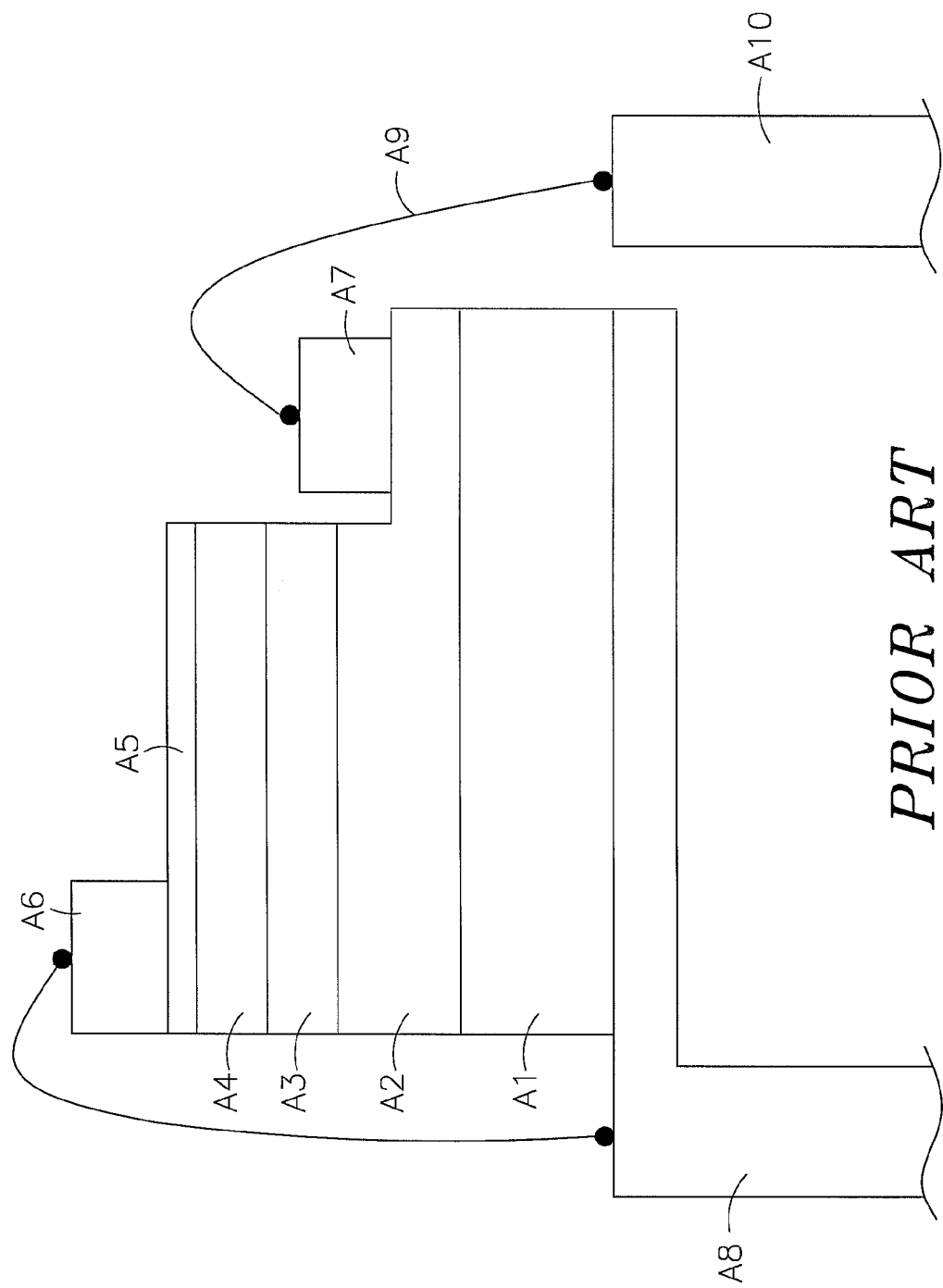
FIG. 12 is a schematic structural view of a GaN LED chip according to the prior art.
Figure 13:
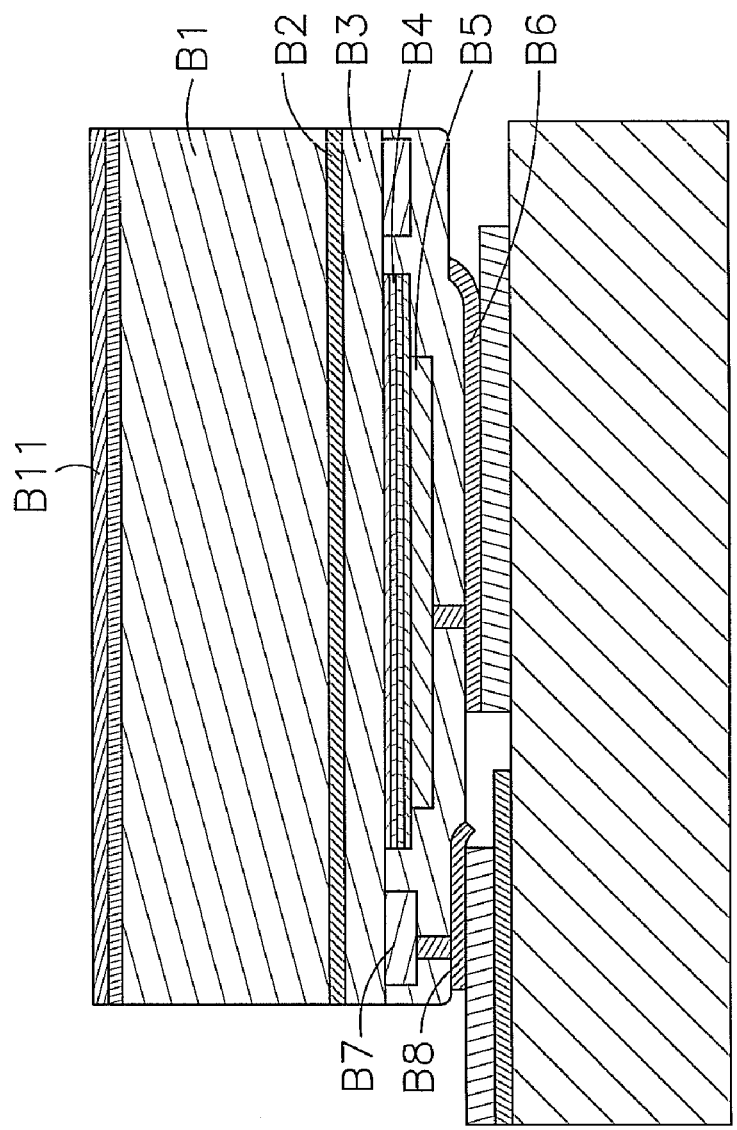
FIG. 13 is a schematic sectional view of a flip-chip LED according to the prior art.
Figure 14:
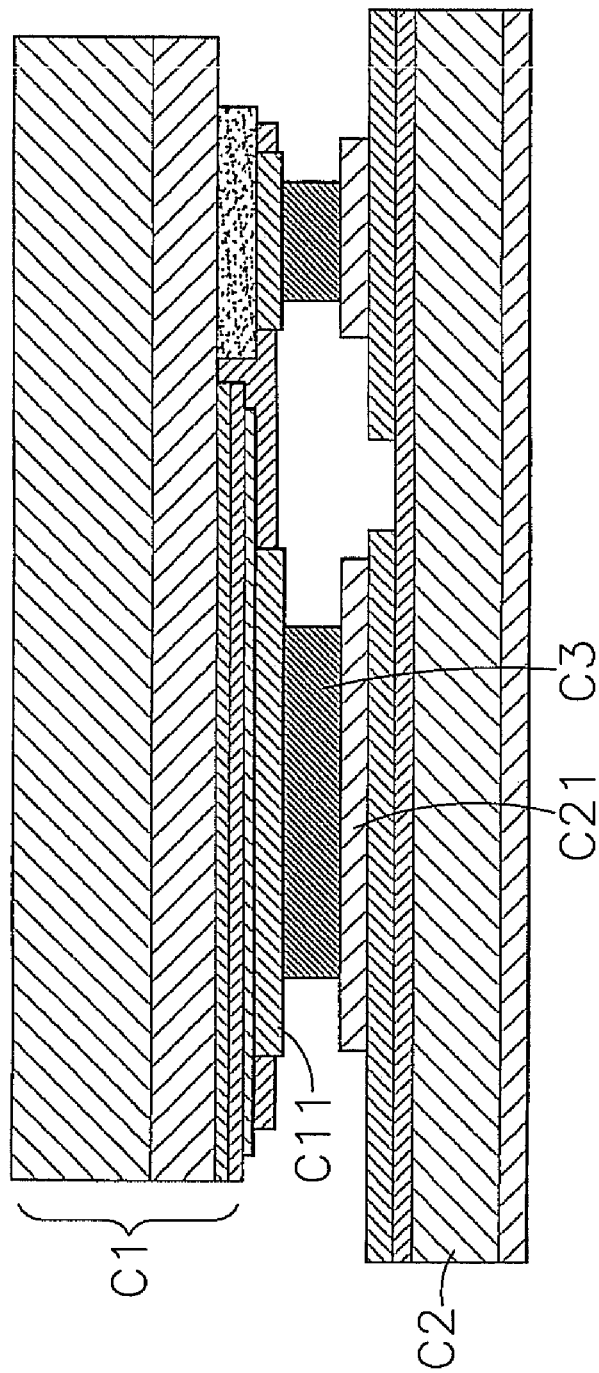
FIG. 14 is a schematic sectional view of another structure of flip-chip LED according to the prior art.
Figure 15:
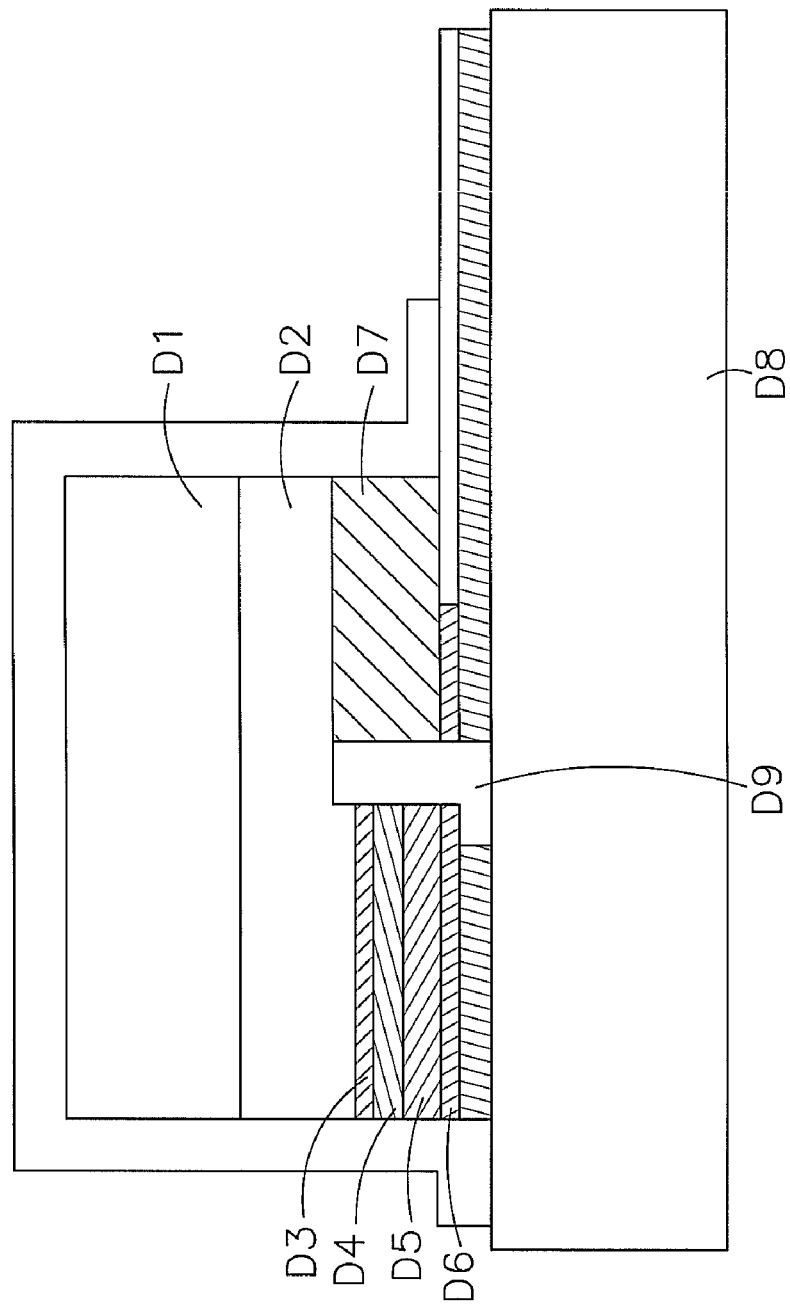
FIG. 15 is a schematic sectional view of still another structure of flip-chip LED according to the prior art.
Figure 16:
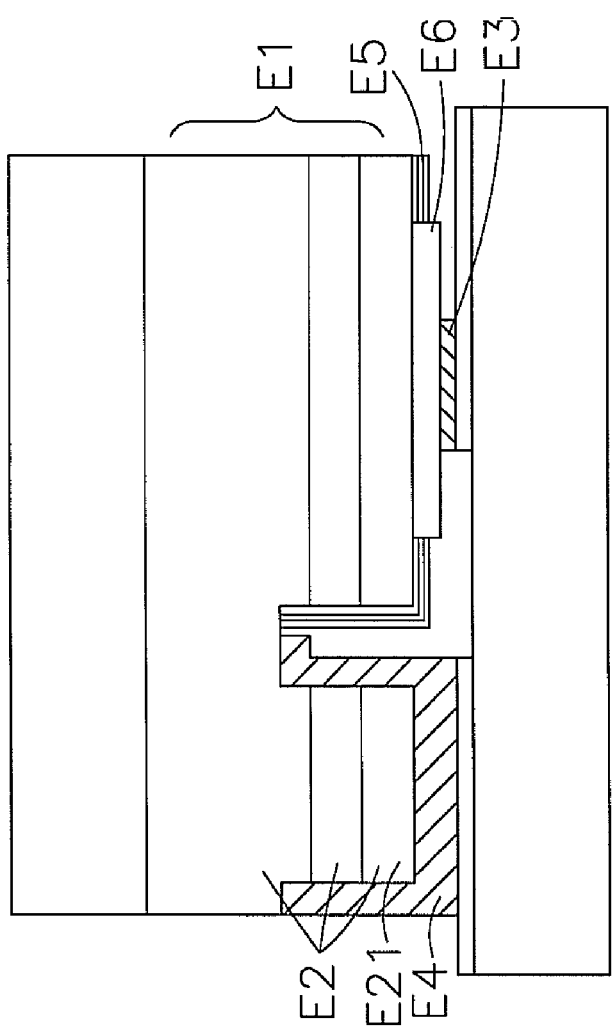
FIG. 16 is a schematic sectional view of still another structure of flip-chip LED according to the prior art.

Referring to FIG. 11 and FIG. 10 again, the first groove 101, the second groove 102 and the third groove 103 can be U-grooves, V-grooves, or grooves configured subject to any other shapes.

In conclusion, the invention provides a clip-chip GaN LED fabrication method, which has the advantages and features as follows:

1. The first isolation protection layer 17 and the metallic reflection layer 18 are respectively formed at two opposite sides relative to the second isolation protection layer 19 so that the translucent conducting layer 14 and the metallic reflection layer 18 are electrically isolated to minimize forward voltage and power consumption during electricity conduction operation of the metallic reflection layer 18, avoiding interference with the light-emitting efficiency of the individual GaN LED chip 1. Further, the metallic reflection layer 18 is directly mounted inside the individual GaN LED chip 1 for direct reflection, avoiding light loss.
2. Subject to the formation of the first groove 101 and the second groove 102 in the GaN epitaxial layer 2 by etching to expose a part of the N-type GaN ohmic contact layer 11 of the GaN epitaxial layer 2 and to divide the GaN epitaxial layer 2 into two epitaxial layer portions 2A; 2B, the posteriorly formed P-type electrode pad 15 and N-type electrode pad 16 have the same elevation, stabilizing electric connection between the individual GaN LED chip 1 and the thermal substrate 3 and improving LED module yield rate.
3. The first isolation protection layer 17 and the second isolation protection layer 19 are formed on the two epitaxial layer portions 2A; 2B at two opposite sides relative to the second groove 102, and therefore, the two epitaxial layer portions 2A; 2B are well isolated and protected, avoiding a short circuit and enhancing operation reliability.
4. The third groove 103 is formed in the first isolation protection layer 17 and the second isolation protection layer 19 adjacent to the metallic reflection layer 18 by etching to expose one lateral side of the N-type electrode pad 16 so that the applied conducting material 4 can climb over the N-type electrode pad 16 into the third groove 103 and be accumulated and cured therein, enhancing the binding strength and the strength of solidification and the connection stability between the N-type electrode pad 16 of the individual GaN LED chip 1 and the negative solder pad 32 of the thermal substrate 3.
5. The individual GaN LED chip 1 is electrically connected with the thermal substrate 3 by means of the large area conducting material 4, and the insulative adhesive 5 is bonded to the thermal substrate 3 between the positive solder pad 31 and the negative solder pad 32 so that the second isolation protection layer 19 can be fixedly secured to the thermal substrate 3 between the positive solder pad 31 and the negative solder pad by means of the conducting material 4, saving the manufacturing cost, facilitating heat dissipation, improving the luminous efficiency of the individual GaN LED chip 1 and its lifespan.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A flip-chip LED fabrication method, comprising the steps of:
    (a) providing a GaN (Gallium Nitride) epitaxial wafer comprising a substrate and a GaN epitaxial layer arranged on said substrate, said GaN epitaxial layer comprising a N-type GaN ohmic contact layer, a light-emitting layer and a P-type semiconductor layer;
    (b) forming a first groove in said GaN epitaxial layer at a predetermined location by etching to expose a part of the substrate of said GaN epitaxial wafer;
    (c) forming a second groove in said GaN epitaxial layer at a predetermined location adjacent to said first groove by etching to expose a part of said N-type GaN ohmic contact layer of said GaN epitaxial layer and to divide said GaN epitaxial layer into two epitaxial layer portions;

(d) forming a translucent conducting layer on said epitaxial layer portions;

(e) forming a P-type electrode pad and an N-type electrode pad on said translucent conducting layer corresponding to said epitaxial layer portions respectively;

(f) forming a first isolation protection layer on said P-type electrode pad, said N-type electrode pad, said first groove and said second groove;

(g) forming a metallic reflection layer on said first isolation protection layer adjacent to said P-type electrode pad and corresponding to said translucent conducting layer;

(h) forming a second isolation protection layer on said first isolation protection layer and said metallic reflection layer;

(i) etching said first isolation protection layer and said second isolation protection layer to form a third groove adjacent to said metallic reflection layer and to expose one lateral side of said N-type electrode pad;

(j) employ grinding, laser wafer scribing, chipping and die sorting techniques to separate the processed GaN (Gallium Nitride) epitaxial wafer into multiple individual GaN LED chips; and (k) bonding at least one said individual GaN LED chip to a thermal substrate with a conducting material to electrically connect the P-type electrode pad and N-type electrode pad of each said individual GaN LED chip to the positive solder pad and negative solder pad of said thermal substrate by said conducting adhesive and to let said conducting adhesive climb over said N-type electrode pad into said third groove and be accumulated and cured therein.

2. The flip-chip LED fabrication method as claimed in claim 1, wherein said first groove, said second groove and said third groove are formed by a dry etching technique.

3. The flip-chip LED fabrication method as claimed in claim 1, wherein said first groove, said second groove and said third groove are formed by a wet etching technique.

4. The flip-chip LED fabrication method as claimed in claim 1, wherein said first groove, said second groove and said third groove have a cross section in one of U-shaped and V-shaped profiles.

5. The flip-chip LED fabrication method as claimed in claim 1, wherein the etching depth of said first groove is greater than the etching depth of said second groove.

6. The flip-chip LED fabrication method as claimed in claim 1, wherein said N-type electrode pad extends to said N-type GaN ohmic contact layer.

7. The flip-chip LED fabrication method as claimed in claim 1, wherein said first isolation protection layer covers said first groove and said second groove completely.

8. The flip-chip LED fabrication method as claimed in claim 1, wherein said metallic reflection layer is selected from the material group of silver (Ag), aluminum (Al) and rhodium (Rh).

9. The flip-chip LED fabrication method as claimed in claim 1, wherein said metallic reflection layer is selected from the material group of silver (Ag), aluminum (Al) and rhodium (Rh) and their composites with nickel (Ni), platinum (Pt), beryllium (Be), titanium (Ti) or chrome (Cr).

10. The flip-chip LED fabrication method as claimed in claim 1, wherein said translucent conducting layer is selected from the group of indium oxide (In2O3), tin oxide (SnO2), IMO (indium molybdenum oxide), zinc oxide (ZnO), indium zinc oxide (IZO), cellium indium oxide (CeIn2O3), ITO (indium tin oxide), metallic bi-layer of N/Au, metallic bi-layer of Pt/Au and metallic bi-layer of Be/Au.

11. The flip-chip LED fabrication method as claimed in claim 1, wherein said first isolation protection layer and said second isolation protection layer are selected from the group of silicon oxide ($SiO_2$), silicon nitride ($Si_3N_4$), liquid glass, Teflon, polyimide (PI), aluminum oxide ($Al_2O_3$), titanium oxide (TiO), tantalum oxide (Ta2O5), yttrium oxide ($Y_2O_3$) and diamond thin film and their alloys.

12. The flip-chip LED fabrication method as claimed in claim 1, wherein said P-type electrode pad and said N-type electrode pad are selected from the group of titanium-gold alloy, titanium-aluminum alloy, chrome-gold alloy and chrome-aluminum alloy.

13. The flip-chip LED fabrication method as claimed in claim 1, wherein said conducting material is selected from the group of silver adhesive, solder balls and solder paste.

14. The flip-chip LED fabrication method as claimed in claim 1, wherein said insulative adhesive is selected from the group of UV light curable adhesive, heat curable adhesive and anaerobic adhesive.

* * * * *